(12) United States Patent
Xu et al.

(10) Patent No.: US 11,067,861 B1
(45) Date of Patent: Jul. 20, 2021

(54) THIN FILM TRANSISTOR SUBSTRATE HAVING ELECTROSTATIC PROTECTION STRUCTURE AND LIQUID CRYSTAL DISPLAY PANEL

(71) Applicant: Century Technology (Shenzhen) Corporation Limited, Shenzhen (CN)

(72) Inventors: Qi Xu, Shenzhen (CN); Tao Wang, Shenzhen (CN); Sheng Xiao, Shenzhen (CN); Hui Wang, Shenzhen (CN); Chih-Chung Liu, New Taipei (TW); Meng-Chieh Tai, New Taipei (TW)

(73) Assignee: Century Technology (Shenzhen) Corporation Limited, Shenzhen (CN)

( * ) Notice: Subject to any disclaimer, the term of this patent is extended or adjusted under 35 U.S.C. 154(b) by 0 days.

(21) Appl. No.: 17/118,946

(22) Filed: Dec. 11, 2020

(30) Foreign Application Priority Data

Aug. 3, 2020 (CN) .......................... 202010769080.2

(51) Int. Cl.
*G02F 1/1362* (2006.01)
*H01L 27/12* (2006.01)
*H01L 27/02* (2006.01)
*G02F 1/1333* (2006.01)
*G02F 1/1368* (2006.01)
*G02F 1/1335* (2006.01)

(52) U.S. Cl.
CPC ...... *G02F 1/136204* (2013.01); *G02F 1/1368* (2013.01); *G02F 1/133345* (2013.01); *G02F 1/133388* (2021.01); *G02F 1/133514* (2013.01); *H01L 27/0292* (2013.01); *H01L 27/1214* (2013.01)

(58) Field of Classification Search
None
See application file for complete search history.

(56) References Cited

U.S. PATENT DOCUMENTS

2015/0062511 A1* 3/2015 Shin ...................... G02F 1/1333
349/122
2020/0043871 A1* 2/2020 Yang ..................... H01L 27/127

* cited by examiner

*Primary Examiner* — Thanh Nhan P Nguyen
(74) *Attorney, Agent, or Firm* — ScienBiziP, P.C.

(57) ABSTRACT

A thin film transistor (TFT) substrate optimized for protection against the build up of static electricity defines a display area and a non-display area surrounding the display area. The TFT substrate includes a substrate and an electrostatic protection structure on the substrate and in the non-display area. The electrostatic protection structure includes a transparent conductive layer and a discharge metal layer on the transparent conductive layer. The discharge metal layer partially overlaps with the transparent conductive layer. The discharge metal layer is in direct contact with the transparent conductive layer. The transparent conductive layer has a width that is greater than a width of the discharge metal layer.

16 Claims, 4 Drawing Sheets

THIN FILM TRANSISTOR SUBSTRATE HAVING ELECTROSTATIC PROTECTION STRUCTURE AND LIQUID CRYSTAL DISPLAY PANEL

FIELD

The subject matter herein generally relates to a thin film transistor (TFT) substrate and a liquid crystal display panel having the TFT substrate.

BACKGROUND

Static electricity is generated during the preparation of a display panel. If the static electricity is accumulated inside the display panel and has no way to be conducted out of the display panel, then the static electricity discharges within the panel, thereby damaging the internal structure of the display panel.

Therefore, there is room for improvement in the art.

BRIEF DESCRIPTION OF THE DRAWINGS

Implementations of the present technology will now be described, by way of embodiments only, with reference to the attached figures.

DETAILED DESCRIPTION

Figure 1:
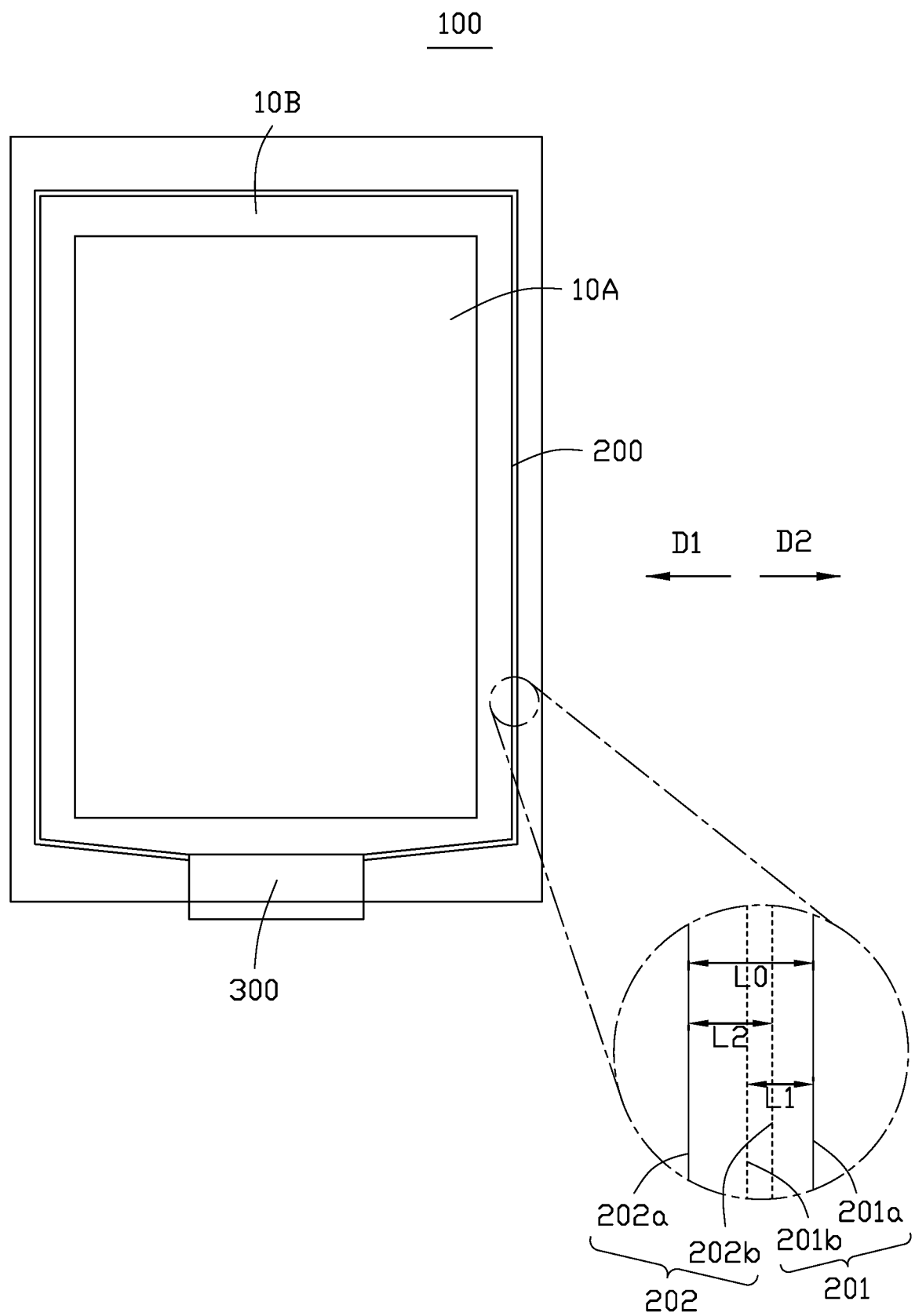
FIG. 1 is a top view of a TFT substrate with an electrostatic protection structure according to an embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

FIG. 1 illustrates a TFT substrate 100 of an embodiment. The TFT substrate 100 includes a display area 10A and a non-display area 10B surrounding the display area 10A. The TFT substrate 100 includes an electrostatic protection structure 200 and a printed circuit board 300, both being in the non-display area 10B. The electrostatic protection structure 200 extends around the display area 10A and is electrically connected to the printed circuit board 300. The printed circuit board 300 provides electrical signals for the TFT substrate 100. In this embodiment, the printed circuit board 300 can also provide a grounding point required in the electrostatic discharge process of the electrostatic protection structure 200, so static electricity can be effectively discharged by the electrostatic protection structure 200. In this embodiment, the printed circuit board 300 may be a flexible printed circuit board (FPC).

Figure 2:
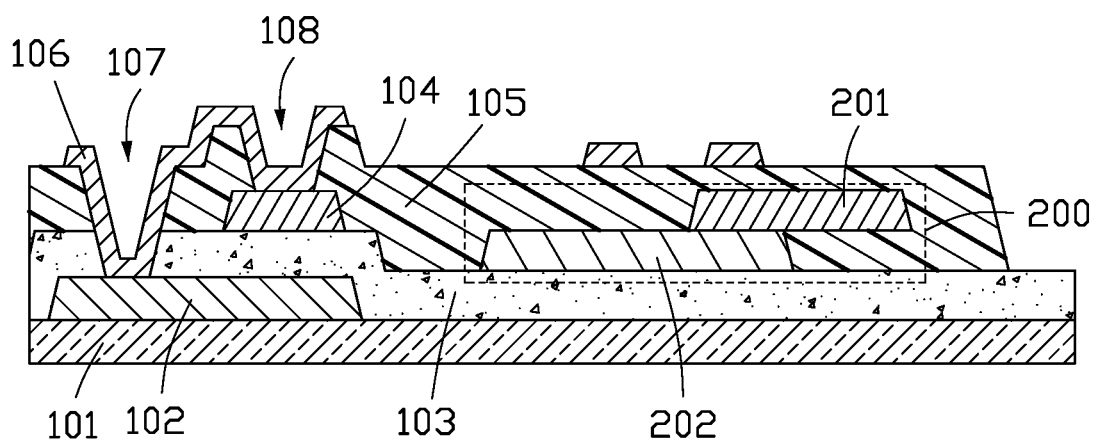
FIG. 2 is a cross-sectional view of a non-display area of the TFT substrate according to a first embodiment of the present disclosure.

As show in FIG. 1 and FIG. 2, the electrostatic protection structure 200 includes a transparent conductive layer 202 and a discharge metal layer 201 on the transparent conductive layer 202. The discharge metal layer 201 partially overlaps with the transparent conductive layer 202. The discharge metal layer 201 is in direct contact with and electrically connected to the transparent conductive layer 202. The transparent conductive layer 202 and the discharge metal layer 201 extend in opposite directions from an overlapped portion of the transparent conductive layer 202 and the discharge metal layer 201, and an extended width of the transparent conductive layer 202 is greater than an extended width of the discharge metal layer 201. The transparent conductive layer 202 has a width that is greater than a width of the discharge metal layer 201. Both the discharge metal layer 201 and the transparent conductive layer 202 extend around the display area.

As shown in FIG. 2, the TFT substrate 100 includes a substrate 101, a first metal layer 102 on the substrate 101, a first insulating layer 103 on the substrate 101 and covering the first metal layer 102, a second metal layer 104 on the first insulating layer 103, and a second insulating layer 105 on the first insulating layer 103 and covering the second metal layer 104. FIG. 2 only shows the non-display area 10B of the TFT substrate 100, in reality the first metal layer 102, the second metal layer 104, the first insulating layer 103, and the second insulating layer 105 also extend to the display area 10A.

In this embodiment, the electrostatic protection structure 200 is located on the first insulating layer 103. The transparent conductive layer 202 is located on the first insulating layer 103. The discharge metal layer 201 and the second metal layer 104 are formed by patterning a single metal layer. The second insulating layer 105 covers the second metal layer 104, the transparent conductive layer 202, and the discharge metal layer 201. The electrostatic protection structure 200 conduct the static electricity to the grounding point of the printed circuit board 300. For example, the electrostatic protection structure 200 can be electrically connected to the pixel units in the display area 10A of the TFT substrate 100 to discharge static electricity in the pixel units, thereby ensuring that the TFT substrate 100 operates normally.

Further referring to FIG. 1, the transparent conductive layer 202 extend in a direction D1 from an overlapped portion of the transparent conductive layer 202 and the discharge metal layer 201, and the discharge metal layer 201 extends in a direction D2 from an overlapped portion of the transparent conductive layer 202 and the discharge metal layer 201. The directions D1 and D2 are opposite to each other. The transparent conductive layer 202 includes a first side 202a adjacent to the display area 10A and a second side 202b away from the display area 10A. A distance between the first side 202a and the second 202b is a width L2 of the transparent conductive layer 202. The discharge metal layer 201 includes a first side 201b adjacent to the display area 10A and a second side 201a away from the display area 10A. A distance between the first side 201a and the second side 201b is a width L1 of the discharge metal layer 201. A distance between the second side 201a and the first side 202a is a total width L0 of the transparent conductive layer 202 and the discharge metal layer 201. The width L0 is greater than the width L1 of the discharge metal layer 201 or the width L2 of the transparent conductive layer 202. The width L2 is greater than the width L1. For better panel design, the greater the width of L2 over L1 the better, which is beneficial to use the transparent conductive layer 202 to discharge static electricity.

A conventional electrostatic discharging structure increases a path of electrostatic discharge by widening the metal lines for electrostatic discharge. However, widening of the metal lines for electrostatic discharge results in increasing opacity of the metal lines, and thereby insufficient curing of the sealant on the panel frame becomes more likely. In this embodiment, the electrostatic protection structure 200 is used for electrostatic discharge. That is, the transparent conductive layer 202 is partially overlapped with and electrically connected to the discharge metal layer 201, and the transparent conductive layer 202 is used for electrostatic discharge. In this disclosure, the transparent conductive layer 202 effectively widens the functioning width of the electrostatic protection structure 200 without widening parts of the discharge metal layer 201, avoiding the risk of insufficient curing of the sealant on the panel frame.

In this embodiment, the transparent conductive layer 202 is made of indium tin oxide, zinc oxide, or aluminum-doped zinc oxide. It can be understood that the material of the transparent conductive layer 202 is not limited to indium tin oxide, zinc oxide, zinc oxide, and aluminum-doped zinc oxide. The substrate 101 may be a transparent glass substrate.

In this embodiment, the TFT substrate 100 further includes a plurality of TFTs (not shown) on the substrate 101 and located in the display area 10A. The discharge metal layer 201 and functional electrodes of the TFTs may be formed by patterning a single metal layer. In this embodiment, the functional electrodes may include source electrodes and drain electrodes of the TFTs. FIG. 2 only shows a part of the second metal layer 104 located in the non-display area 10B, in fact the second metal layer 104 also extends to the display area 10A, so that a part of the second metal layer 104 forms source electrodes (not shown) and drain electrodes (not shown) of the TFTs.

Further referring to FIG. 2, the TFT substrate 100 further includes a conductive connection layer 106. A first opening 107 is defined in the first insulating layer 103 and the second insulating layer 105 to expose the first metal layer 102. A second opening 108 is defined in the second insulating layer 105 to expose the second metal layer 104. The conductive connection layer 106 is formed on the second insulating layer 105 and extends into the first opening 107 and the second opening 108, realizing electrical connections between the first metal layer 102 and the second metal layer 104.

In this embodiment, the conductive connection layer 106 may be a transparent conductive layer. The conductive connection layer 106 is made of indium tin oxide, zinc oxide, or aluminum-doped zinc oxide, but it is not limited thereto.

Figure 3:
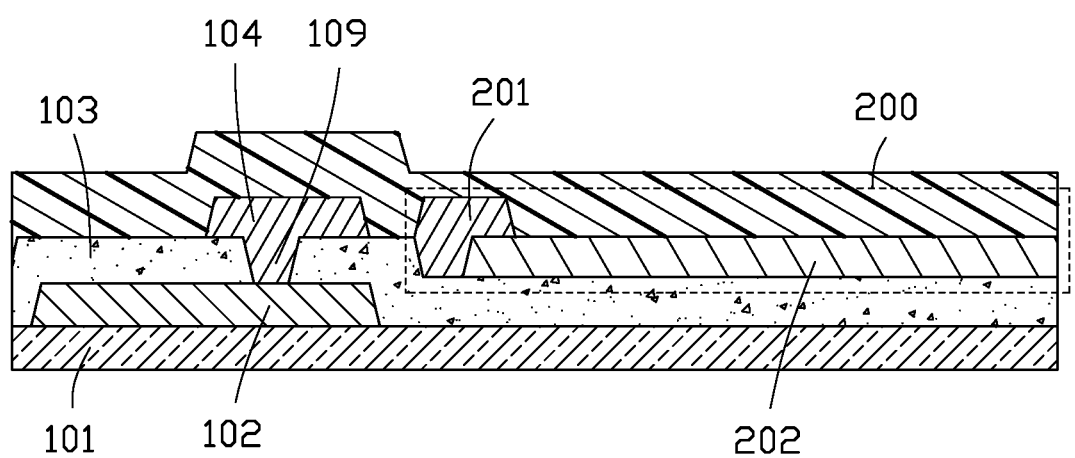
FIG. 3 is a cross-sectional view of a non-display area of a TFT substrate according to a second embodiment of the present disclosure.

FIG. 3 illustrates a TFT substrate 400 of a second embodiment. The difference between the TFT substrate 400 and the TFT substrate 100 of the first embodiment of FIG. 2 is that the first metal layer 102 and the second metal layer 104 in the TFT substrate 400 are not electrically connected by the conductive connection layer 106, the first opening 107, and the second opening 108.

In this example, the TFT substrate 400 includes a substrate 101, a first metal layer 102 on the substrate 101, a first insulating layer 103 on the substrate 101 and covering the first metal layer 102, a second metal layer 104 on the first insulating layer 103, and a second insulating layer 105 on the first insulating layer 103 and covering the second metal layer 104. An opening 109 is defined in the first insulating layer 103 to expose the first metal layer 102, and the second metal layer 104 and the first metal layer 102 are electrically connected by the opening 109.

The TFT substrate 400 and the TFT substrate 100 are TFT substrates with different manufacturing processes. The electrostatic protection structure 200 is applicable to the TFT substrate 400 and the TFT substrate 100, and applicable to other TFT substrates.

Figure 4:
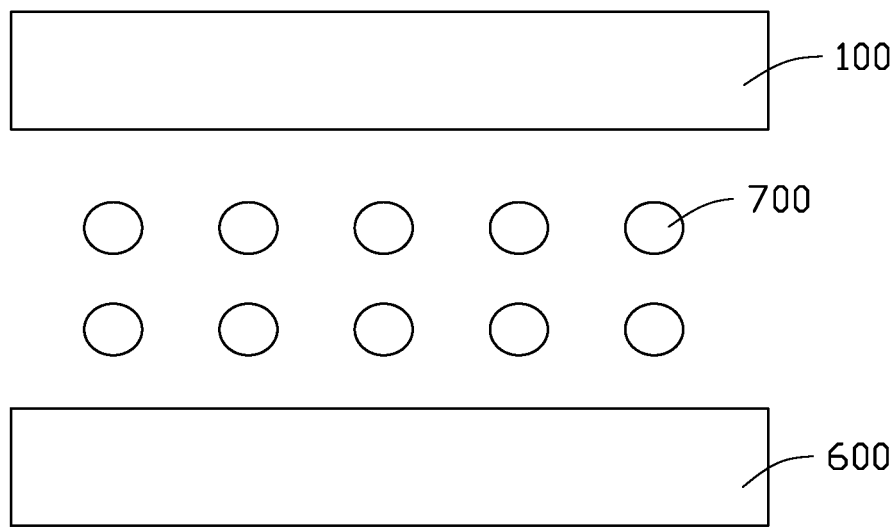
FIG. 4 is a cross-sectional view of a liquid crystal display panel according to an embodiment of the present disclosure.

FIG. 4 illustrates a liquid crystal display panel 500 according to an embodiment of the present disclosure. The liquid crystal display panel 500 includes the TFT substrate 100, a color filter substrate 600, and a liquid crystal layer 700 between the TFT substrate 100 and the color filter substrate 600.

The liquid crystal display panel 500 is in an electronic device that needs a display screen, such as mobile phone, mobile TV, smart phone, BLUETOOTH devices, wireless email receiver, handheld or portable computer, mini laptop, notebook computer, smart book, tablet computer, printer, copier, scanner, fax machine, GPS receiver/navigator, camera, digital media player, camcorder, games controlling panel, watch, clock, calculator, TV monitor, flat panel display, e-reading device (e.g. e-readers), mobile health device, computer monitor, car dashboard display (including odometer display, speedometer display, etc.), cockpit control and/or display, camera landscape display (e.g., rear-view camera display in vehicle), electronic photograph, electronic billboard or sign, projector, refrigerator, scrubber, dryer, scrubber/dryer device, aesthetic structure (for example, an image displaying a piece of jewelry or clothing), but is not limited to these.

The electrostatic protection structure 200 is configured to discharge static electricity. The transparent conductive layer 202 is partially overlapped with and electrically connected to the discharge metal layer 201, and the transparent conductive layer 202 is used for electrostatic discharge. In this way, the transparent conductive layer 202 creates additional width of the electrostatic protection structure 200 without widening the opaque discharge metal layer 201, thereby avoiding insufficient curing of the sealant on the panel frame.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A thin film transistor (TFT) substrate, the TFT substrate defining a display area and a non-display area surrounding the display area, comprising:
   a substrate;

an electrostatic protection structure on the substrate and in the non-display area, wherein the electrostatic protection structure comprises a transparent conductive layer and a discharge metal layer on the transparent conductive layer;

the discharge metal layer partially overlaps with the transparent conductive layer, the discharge metal layer is in direct contact with the transparent conductive layer; the transparent conductive layer has a width that is greater than a width of the discharge metal layer.

2. The TFT substrate of claim 1, wherein both the discharge metal layer and the transparent conductive layer extend around the display area.

3. The TFT substrate of claim 2, wherein the TFT substrate further comprises a printed circuit board in the non-display area, the electrostatic protection structure extends around the display area and is electrically connected to the printed circuit board.

4. The TFT substrate of claim 1, wherein the TFT substrate further comprises a substrate, a first metal layer on the substrate, a first insulating layer on the substrate and covering the first metal layer, a second metal layer on the first insulating layer, and a second insulating layer on the first insulating layer and covering the second metal layer.

5. The TFT substrate of claim 4, wherein the transparent conductive layer is formed on the first insulating layer, and the discharge metal layer and the second metal layer is defined by patterning a single metal layer; and the second insulating layer covers the transparent conductive layer, the discharge metal layer, and the second metal layer.

6. The TFT substrate of claim 5, wherein the TFT substrate further comprises a plurality of TFTs in the display area, the second metal layer forms function electrodes of the plurality of TFTs.

7. The TFT substrate of claim 5, wherein the TFT substrate further comprises a conductive connection layer; a first opening defined in the first insulating layer and the second insulating layer to expose the first metal layer; a second opening is defined in the second insulating layer to expose the second metal layer; the conductive connection layer is formed on the second insulating layer and extends into the first opening and the second opening to realize electrical connection between the first metal layer and the second metal layer.

8. The TFT substrate of claim 5, wherein an opening is defined in the first insulating layer to expose the first metal layer, and the second metal layer and the first metal layer are electrically connected by the opening.

9. A liquid crystal display panel, comprising:
a color filter substrate;
a thin film transistor (TFT) substrate, and
a liquid crystal layer between the TFT substrate and the color filter substrate;

the TFT substrate defining a display area and a non-display area surrounding the display area, comprising:
a substrate;
an electrostatic protection structure on the substrate and in the non-display area, wherein the electrostatic protection structure comprises a transparent conductive layer and a discharge metal layer on the transparent conductive layer;

the discharge metal layer partially overlaps with the transparent conductive layer, the discharge metal layer is in direct contact with the transparent conductive layer; the transparent conductive layer has a width that is greater than a width of the discharge metal layer.

10. The liquid crystal display panel of claim 9, wherein both the discharge metal layer and the transparent conductive layer extend around the display area.

11. The liquid crystal display panel of claim 10, wherein the TFT substrate further comprises a printed circuit board in the non-display area, the electrostatic protection structure extends around the display area and is electrically connected to the printed circuit board.

12. The liquid crystal display panel of claim 9, wherein the TFT substrate further comprises a substrate, a first metal layer on the substrate, a first insulating layer on the substrate and covering the first metal layer, a second metal layer on the first insulating layer, and a second insulating layer on the first insulating layer and covering the second metal layer.

13. The liquid crystal display panel of claim 12, wherein the transparent conductive layer is formed on the first insulating layer, and the discharge metal layer and the second metal layer are defined by patterning a single metal layer; and the second insulating layer covers the transparent conductive layer, the discharge metal layer, and the second metal layer.

14. The liquid crystal display panel of claim 13, wherein the TFT substrate further comprises a conductive connection layer; a first opening defined in the first insulating layer and the second insulating layer to expose the first metal layer; a second opening is defined in the second insulating layer to expose the second metal layer; the conductive connection layer is formed on the second insulating layer and extends into the first opening and the second opening to realize electrical connection between the first metal layer and the second metal layer.

15. The liquid crystal display panel of claim 13, wherein an opening is defined in the first insulating layer to expose the first metal layer, and the second metal layer and the first metal layer are electrically connected by the opening.

16. The liquid crystal display panel of claim 9, wherein the TFT substrate further comprises a plurality of TFTs in the display area, the second metal layer forms function electrodes of the plurality of TFTs.

* * * * *